US012278166B2

(12) United States Patent
Chuang et al.

(10) Patent No.: US 12,278,166 B2
(45) Date of Patent: Apr. 15, 2025

(54) HIGH BANDWIDTH PACKAGE STRUCTURE

(71) Applicant: Taiwan Semiconductor Manufacturing Company, Ltd., Hsinchu (TW)

(72) Inventors: Harry-Haklay Chuang, Hsinchu (TW); Wen-Tuo Huang, Tainan (TW); Wei-Cheng Wu, Hsinchu County (TW); Yu-Ling Hsu, Tainan (TW); Pai Chi Chou, Hsinchu (TW); Ya-Chi Hung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 405 days.

(21) Appl. No.: 17/831,040

(22) Filed: Jun. 2, 2022

(65) Prior Publication Data

US 2023/0395466 A1 Dec. 7, 2023

(51) Int. Cl.
*H01L 23/48* (2006.01)
*H01L 21/02* (2006.01)
(Continued)

(52) U.S. Cl.
CPC ...... *H01L 23/481* (2013.01); *H01L 21/02164* (2013.01); *H01L 21/02181* (2013.01); *H01L 21/02183* (2013.01); *H01L 21/76898* (2013.01); *H01L 24/08* (2013.01); *H01L 24/80* (2013.01); *H01L 25/0657* (2013.01);
(Continued)

(58) Field of Classification Search
CPC ............... H01L 25/0657; H01L 23/481; H01L 21/02164; H01L 21/02181; H01L 21/02183; H01L 21/76898; H01L 24/08; H01L 2224/08148; H01L 2224/80895;
(Continued)

(56) References Cited

U.S. PATENT DOCUMENTS 11,289,450 B2 3/2022 Chen et al.
2021/0225809 A1 7/2021 Yu et al.
(Continued)

FOREIGN PATENT DOCUMENTS

TW 202115869 A 4/2021
TW 202220140 A 5/2022

*Primary Examiner* — Thanh Y. Tran
(74) *Attorney, Agent, or Firm* — HAYNES AND BOONE, LLP

(57) ABSTRACT

A method according to the present disclosure includes providing a first workpiece that includes a first substrate and a first interconnect structure, providing a second workpiece that includes a second substrate, a second interconnect structure, and a through via extending through a portion of the second substrate and a portion of the second interconnect structure, forming a first bonding layer on the first interconnect structure, forming a second bonding layer on the second interconnect structure, bonding the second workpiece to the first workpiece by directly bonding the second bonding layer to the first bonding layer, thinning the second substrate, forming a protective film over the thinned second substrate, forming a backside via opening through the protective film and the thinned second substrate to expose the through via, and forming a backside through via in the backside via opening to physically couple to the through via.

20 Claims, 14 Drawing Sheets

(51) Int. Cl.
*H01L 21/768* (2006.01)
*H01L 23/00* (2006.01)
*H01L 25/065* (2023.01)

(52) U.S. Cl.
CPC ............... *H01L 2224/08148* (2013.01); *H01L 2224/80895* (2013.01); *H01L 2224/80896* (2013.01); *H01L 2225/06524* (2013.01); *H01L 2225/06544* (2013.01); *H01L 2924/1431* (2013.01); *H01L 2924/1436* (2013.01)

(58) Field of Classification Search
CPC . H01L 2225/06524; H01L 2225/06544; H01L 2924/1431; H01L 2924/1436
See application file for complete search history.

(56) References Cited

U.S. PATENT DOCUMENTS

2021/0375790 A1* 12/2021 Oda ..................... H01L 24/80
2023/0307322 A1* 9/2023 Chuang ............... H01L 25/0657
2023/0361066 A1* 11/2023 Chen .................... H01L 25/18

* cited by examiner

HIGH BANDWIDTH PACKAGE STRUCTURE

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

High Bandwidth Memory (HBM) has been adopted by Joint Electron Device Engineering Council (JEDEC) as an industry standard. The existing HBM structure includes multiple dynamic random access memory (DRAM) dies stacked vertically over a base logic die. Each of the multiple DRAM dies include through-substrate vias (or through-silicon vias, TSVs) such that the vertically stacked DRAM dies may be connected by micro-bumps. The bottom DRAM die also communicates with the base logic die by way of micro-bumps. While existing HBM structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
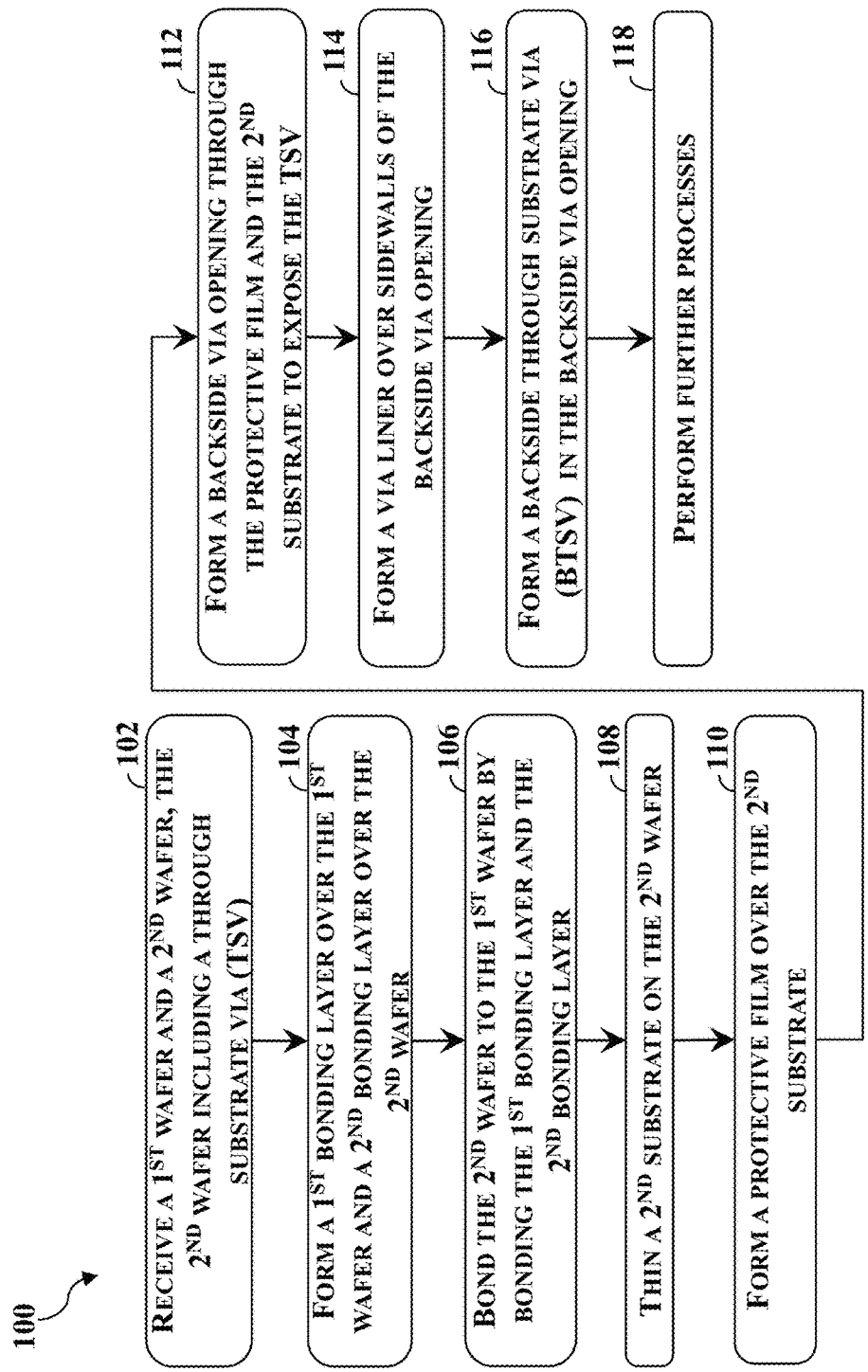
FIG. 1 is a flow chart illustrating an embodiment of a method of forming a package structure including a first wafer and a second wafer, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

High Bandwidth Memory (HBM) has been adopted by Joint Electron Device Engineering Council (JEDEC) as an industry standard. The existing HBM structure includes multiple dynamic random access memory (DRAM) dies stacked vertically over a base logic die. Each of the multiple DRAM dies may include through-substrate vias (or through-silicon vias, TSVs) such that the vertically stacked DRAM dies may be connected by micro-bumps. The bottom DRAM die also communicates with the base logic die by way of micro-bumps. Studies have indicated that the bandwidth of the existing HBM structure is limited primarily by the communication between the DRAM die and the logic die.

The present disclosure provides a high bandwidth memory structure where a bottom logic wafer and a top memory wafer communicate by way of a first bonding layer and a second bonding layer. The first bonding layer is disposed on a top metal layer of the bottom logic wafer and the second bonding layer is disposed on a top metal layer of the top memory wafer. Each of the first bonding layer and the second bonding layer includes contact features. The arrangement of the contact features in the first bonding layer and the second bonding layer are such that when the top memory die is flipped over, the contact features in the first bonding layer and the second bonding layer are substantially aligned. The first bonding layer of the bottom logic wafer and the second bonding layer of the top memory wafer are bonded by direct bonding. Because the contact features have a greater density than micro-bumps, the high bandwidth memory structure of the present disclosure can achieve a bandwidth about 10 times to about 100 times of that of the existing similarly situated memory structure. Additionally, the present disclosure provides a backside through-substrate via (BTSV) that physically couples to a frontside through-substrate via (FTSV) to achieve vertical through-wafer communication.

The various aspects of the present disclosure will now be described in more detail with reference to the figures. In that regard, FIG. 1 is a flowchart illustrating a method 100 of forming a package structure that includes a first wafer and a second wafer, according to various aspects of the present disclosure. Method 100 is merely an example and is not intended to limit the present disclosure to what is explicitly illustrated in method 100. Additional steps can be provided before, during and after method 100, and some steps described can be replaced, eliminated, or moved around for additional embodiments of the method. Not all steps are described herein in detail for reasons of simplicity. Method 100 is described below in conjunction with FIG. 2-14, which are fragmentary cross-sectional views of a first wafer, a second wafer or a stacked wafer at different stages of fabrication according to various embodiments of method 100. For avoidance of doubts, the X, Y and Z directions in FIGS. 2-14 are perpendicular to one another. Throughout the present disclosure, unless expressly otherwise described, like reference numerals denote like features.

Figure 2:
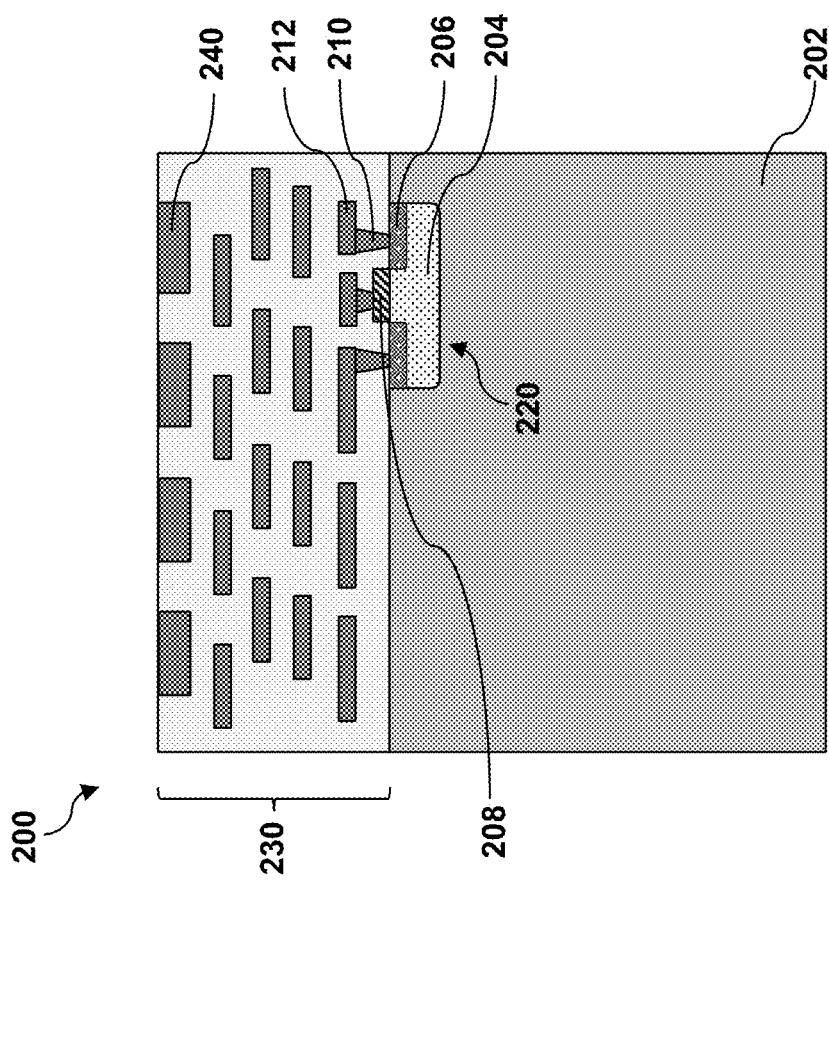
FIGS. 2-14 are fragmentary cross-sectional views of a first wafer, a second wafer or a stacked wafer undergoing operations of the method in FIG. 1, according to various aspects of the present disclosure.
Figure 3:
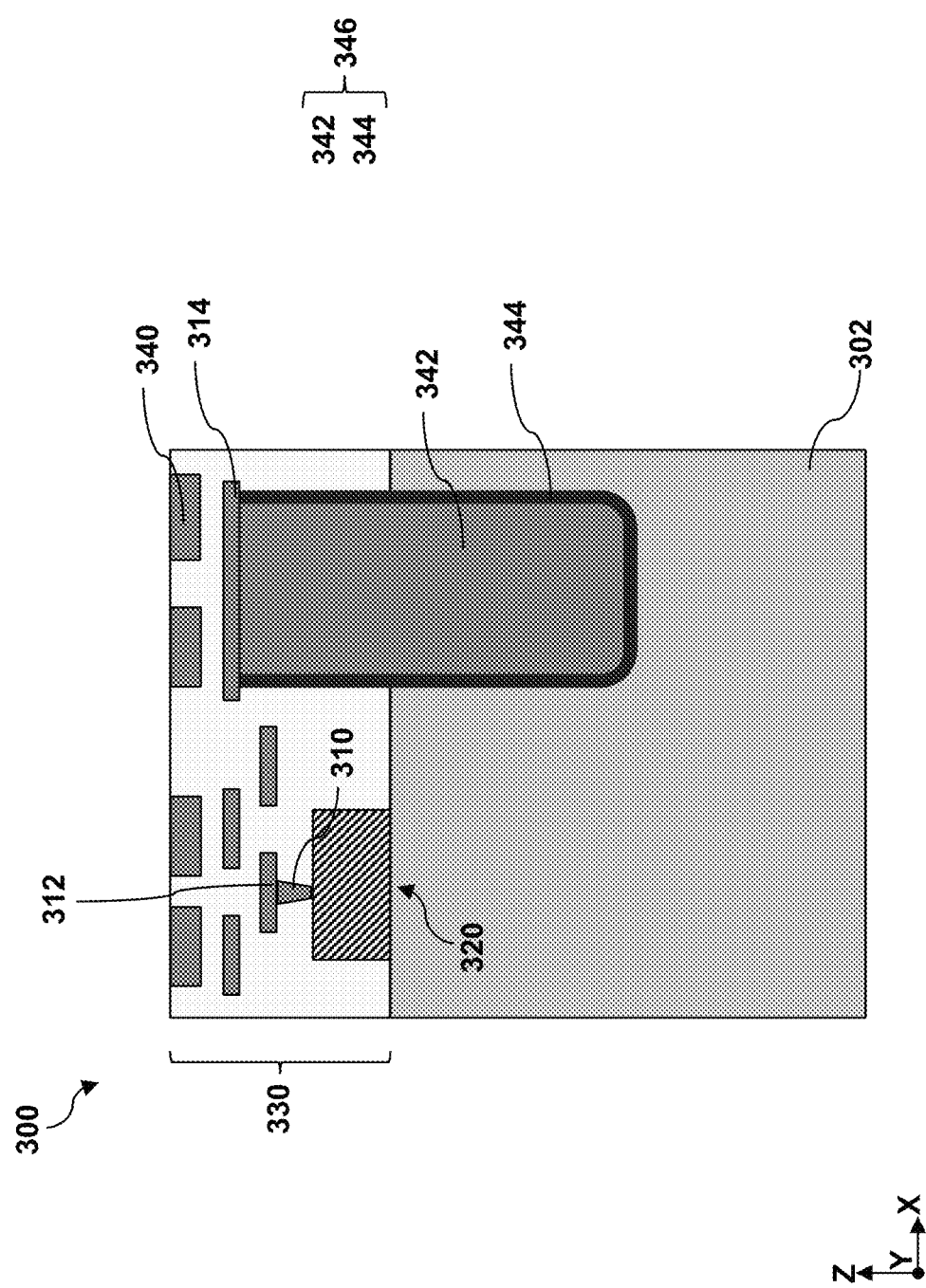

Referring to FIGS. 1, 2 and 3, method 100 includes a block 102 where a first wafer 200 and a second wafer 300 are provided. The first wafer 200 shown in FIG. 2 includes a first substrate 202, a logic transistor 220 fabricated on first the substrate 202, and a first interconnect structure 230 over the first substrate 202. The second wafer 300 shown in FIG. 3 includes a second substrate 302, a memory device 320 fabricated on the second substrate 302, and a second interconnect structure 330 over the second substrate 302. In an embodiment, both the first substrate 202 and the second substrate 302 include silicon (Si). Alternatively, the first substrate 202 and the second substrate 302 may include a compound semiconductor, such as silicon carbide (SiC), gallium arsenide (GaAs), gallium phosphide (GaP), indium phosphide (InP), indium arsenide (InAs), and/or indium antimonide; an alloy semiconductor, such as silicon germanium (SiGe), GaAsP, AlInAs, AlGaAs, GaInAs, GaInP, and/or GaInAsP; or combinations thereof. Alternatively, the first substrate 202 and the second substrate 302 may be semiconductor-on-insulator substrates, such as a silicon-on-insulator (SOI) substrates, silicon germanium-on-insulator (SGOI) substrates, or germanium-on-insulator (GeOI) substrates. Semiconductor-on-insulator substrates can be fabricated using separation by implantation of oxygen (SIMOX), wafer bonding, and/or other suitable methods. Both the first substrate 202 and the second substrate 302 can include various doped regions (not shown) depending on design requirements. In some implementations, the first substrate 202 and the second substrate 302 include p-type doped regions (for example, p-type wells) doped with p-type dopants, such as boron (for example, $BF_2$), indium, other p-type dopant, or combinations thereof. In some implementations, the first substrate 202 and the second substrate 302 include n-type doped regions (for example, n-type wells) doped with n-type dopants, such as phosphorus (P), arsenic (As), other n-type dopant, or combinations thereof. In some implementations, the first substrate 202 and the second substrate 302 include doped regions formed with a combination of p-type dopants and n-type dopants. The various doped regions can be formed directly on and/or in the first substrate 202 and the second substrate 302, for example, to provide a p-well structure, an n-well structure, a dual-well structure, a raised structure, or combinations thereof. An ion implantation process, a diffusion process, and/or other suitable doping process can be performed to form the various doped regions.

Referring to FIG. 2, the logic transistor 220 may be a planar transistor or a multi-gate transistor, such as a fin-like field effect transistor (FinFET) or a gate-all-around (GAA) transistor. A planar transistor includes a gate structure that may induce a planar channel region along one surface of its active region, hence its name. A FinFET includes a fin-shaped active region arising from a substrate and a gate structure disposed over a top surface and sidewalls of the fin-shaped active region. A GAA transistor includes at least one channel member extending between two source/drain features and a gate structure that wraps completely around the at least one channel member. Because its gate structure wraps around the channel member, a GAA transistor may also be referred to as a surrounding gate transistor (SGT). Depending on the shapes and orientation, a channel member in a GAA transistor may be referred to as a nanosheet, a semiconductor wire, a nanowire, a nanostructure, a nanopost, a nano-beam, or a nano-bridge. In some instances, a GAA transistor may be referred to by the shape of the channel member. For example, a GAA transistor having one or more nanosheet channel member may also be referred to as a nano sheet transistor or a nanosheet FET. The logic transistor 220 representatively shown in FIG. 2 is a planar device that includes a gate structure 208 disposed over a channel region of an active region 204 disposed in the first substrate 202. The logic transistor 220 also includes source/drain regions 206. While the device 220 is shown as a planar device in FIG. 2 and subsequent figures, it should be understood that the logic transistor 220 may as well be a FinFET or a GAA transistor.

While not explicitly shown, the gate structure 208 includes an interfacial layer interfacing the channel region, a gate dielectric layer over the interfacial layer, and a gate electrode layer over the gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods.

The gate electrode layer of the gate structure 208 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

The source/drain regions 206 may be doped regions in the active region 204 or epitaxial features deposited using vapor-phase epitaxy (VPE), ultra-high vacuum CVD (UHV-CVD), molecular beam epitaxy (MBE), and/or other suitable processes. When the source/drain regions 206 are n-type, it may include silicon (Si) doped with an n-type dopant, such as phosphorus (P) or arsenic (As). When the source/drain regions 206 are p-type, it may include silicon (Si) or silicon germanium (SiGe) doped with a p-type dopant, such as boron (B) or boron difluoride ($BF_2$).

Although not explicitly shown in FIG. 2, multiple active regions like the active region 204 are formed over the first substrate 202. The active regions may be isolated from one another by an isolation feature. In some implementations, the isolation features may be formed by etching a trench in the first substrate 202 or an epitaxial layer on the first substrate 202 using a dry etch process and filling the trench with insulator material using a chemical vapor deposition (CVD) process, flowable CVD (FCVD) process, or a spin-on glass process. A chemical mechanical polishing (CMP) process may be performed to remove excessive insulator material and to provide a planar surface. In cases where the logic transistor 220 is a multi-gate device, the insulator material is also etched back such that the fins or fin-like structures rise above the isolation feature In some implementations, the isolation features may include a multi-layer structure that includes a liner dielectric layer and bulk dielectric layer. The isolation feature may include silicon oxide, silicon oxynitride, boron silicate glass (BSG), or phosphosilicate glass (PSG).

Referring to FIG. 2, the first interconnect structure 230 may include eight (8) to sixteen (16) metal layers. While only four metal layers and a top metal layer are shown in FIG. 2 for simplicity, the first interconnect structure 230 may include more metal layers which are omitted. Each of the metal layers includes an etch stop layer (ESL) (not explicitly shown) and an intermetal dielectric (IMD) layer disposed on the ESL. It can be said that ESLs interleave the IMD layers or that IMD layers interleave the ESLs. The ESLs may include silicon carbide, silicon nitride or silicon oxynitride. The IMD layers may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof. Example low-k dielectric materials include carbon doped silicon oxide, Xerogel, Aerogel, amorphous fluorinated carbon, benzocyclobutene (BCB), or polyimide.

Referring still to FIG. 2, each of the metal layers and the top metal layer includes a plurality of vertically extending vias and horizontally metal lines. By way of example, a contact via 210, a metal line 212, and a top metal feature 240 are illustrated in FIG. 2. The contact via 210 and the metal line 212 are disposed in the first metal layer, which is the metal layer closest to the logic transistor 220. The top metal feature 240 is disposed in the top metal layer and is exposed on a top surface of the first interconnect structure 230. As shown in FIG. 2, the first interconnect structure 230 also include other contact vias, metal lines and top metal features that are not separately labeled. The contact vias, metal lines may include copper (Cu), tantalum (Ta), nickel (Ni), cobalt (Co), aluminum (Al), or a combination thereof. In one embodiment, the contact vias and metal lines include copper. The top metal feature 240 may include copper (Cu), aluminum (Al), or an alloy thereof. In one embodiment, the top metal feature 240 may include an alloy of aluminum and copper. While not explicitly shown, the contact vias, metal lines and top metal features may further include a barrier layer to interface the oxygen-containing IMDs. The barrier layer may include titanium nitride (TiN), tantalum nitride (TaN), manganese nitride (MnN), or other transition metal nitride.

Reference is now made to FIG. 3. The memory device 320 may be a dynamic random access memory (DRAM). The memory device 320 may include an access transistor and a storage capacitor. In terms of electrical connections, a word line (WL) is electrically coupled to a gate of the access transistor, one source/drain of the access transistor is electrically coupled to the storage capacitor and the other source/drain of the access transistor is electrically coupled to a bit line. In a "write" operation, the word line is activated to turn on the access transistor and the bit line is used to store or deplete a charge in the storage capacitor. In a "read" operation, the word line is activated such that the charge stored in the storage capacitor can be measured by a sense amplifier. The sense amplifier detects the minute difference in charge and outputs the corresponding logic level—"1" or "0". Different from the memory device 320, the logic transistor 220 in the first wafer 200 does not have a storage transistor coupled to one of its source/drain regions 206. The access transistor may be similar to the logic transistor 220 in terms of structures and materials.

The second interconnect structure 330 may include eight (8) to sixteen (16) metal layers. For ease of illustration, the second interconnect structure 330 in FIG. 3 only include two metal layers and a top metal layer. It should be understood that the second interconnect structure 330 may include several additional metal layers. Like the first interconnect structure 230, each of the metal layers includes an etch stop layer (ESL) (not explicitly shown) and an intermetal dielectric (IMD) layer disposed on the ESL. It can be said that ESLs interleave the IMD layers or that IMD layers interleave the ESLs. The ESLs may include silicon carbide, silicon nitride or silicon oxynitride. The IMD layers may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof. Example low-k dielectric materials include carbon doped silicon oxide, Xerogel, Aerogel, amorphous fluorinated carbon, benzocyclobutene (BCB), or polyimide.

Referring still to FIG. 3, each of the metal layers and the top metal layer in the second interconnect structure 330 includes a plurality of vertically extending vias and horizontally metal lines. By way of example, a contact via 310, a metal line 312, and a top metal feature 340 are illustrated in FIG. 3. The contact via 310 and the metal line 312 are disposed in the first metal layer, which is the metal layer closest to the memory device 320. The top metal feature 340 is disposed in the top metal layer and is exposed on a top surface of the second interconnect structure 330. As shown in FIG. 3, the second interconnect structure 330 also include other contact vias, metal lines and top metal features that are not separately labeled. The contact vias and metal lines in the second interconnect structure 330 may include copper (Cu), tantalum (Ta), nickel (Ni), cobalt (Co), aluminum (Al), or a combination thereof. The top metal feature 340 may include copper (Cu), aluminum (Al), or an alloy thereof. In one embodiment, the top metal feature 340 may include an alloy of aluminum and copper. While not explicitly shown, the contact vias, metal lines and top metal features may further include a barrier layer to interface the oxygen-containing IMDs. The barrier layer may include titanium nitride (TiN), tantalum nitride (TaN), manganese nitride (MnN), or other transition metal nitride. In the depicted embodiment, the second interconnect structure 330 has fewer metal layers than the first interconnect structure 230.

Referring to FIG. 3, the second wafer 300 also includes a through-substrate via (or through-silicon via, TSV) 346 that extends through a portion of the second interconnect structure 330 and a portion of the second substrate 302. Because the TSV 346 is formed from a front side of the second wafer 300, the TSV 346 may also be referred to as a frontside TSV (FTSV) 346. In some embodiments, the FTSV 346 includes a TSV liner 344 and a TSV filler 342. The TSV liner 344 may include silicon oxide, silicon oxynitride, or silicon nitride. The TSV filler 342 may include copper (Cu), tantalum (Ta), nickel (Ni), cobalt (Co), aluminum (Al), or a combination thereof. In one embodiment, the TSV filler 342 includes copper (Cu) and may be formed using an electroplating process. In an example process, a seed layer is first deposited using physical vapor deposition (PVD) or chemical vapor deposition (CVD) and then the bulk of the TSV filler 342 is deposited using electroplating. As shown in FIG. 3, the FTSV 346 extends upward from with the second substrate 302 and terminates at a metal line 314 in a second metal layer of the second interconnect structure 330. While not explicitly shown in the figures, a via barrier layer spaces the TSV filler 342 from the TSV liner 344. The via barrier layer may include titanium nitride (TiN), tantalum nitride (TaN), manganese nitride (MnN), or other transition metal nitride.

Because the first wafer 200 includes the logic transistor 220, the first wafer 200 may be referred to as a logic wafer 200. As will be described below, the first wafer 200 is to be disposed below the second wafer 300 in a wafer bonding process. For that reason, the first wafer 200 may also be referred to as a bottom wafer 200 or a base wafer 200. The second wafer 300, which includes the memory device 320, may also be referred to as a memory wafer 300. When the memory device 320 is a DRAM, the second wafer 300 may also be referred to as a DRAM wafer. Because the second wafer 300 is disposed over the second wafer 300 after the bonding process, the second wafer 300 may additionally be referred to as a top wafer 300.

Figure 4:
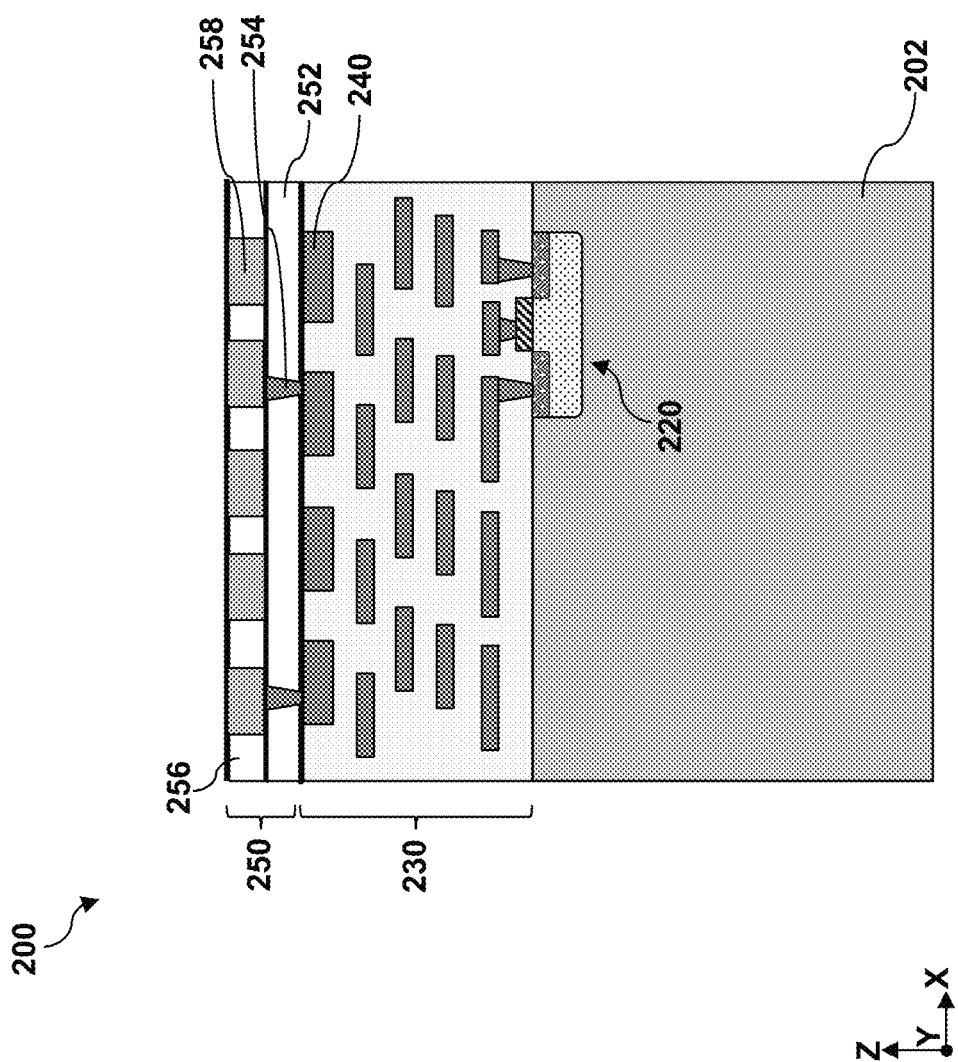
Figure 5:
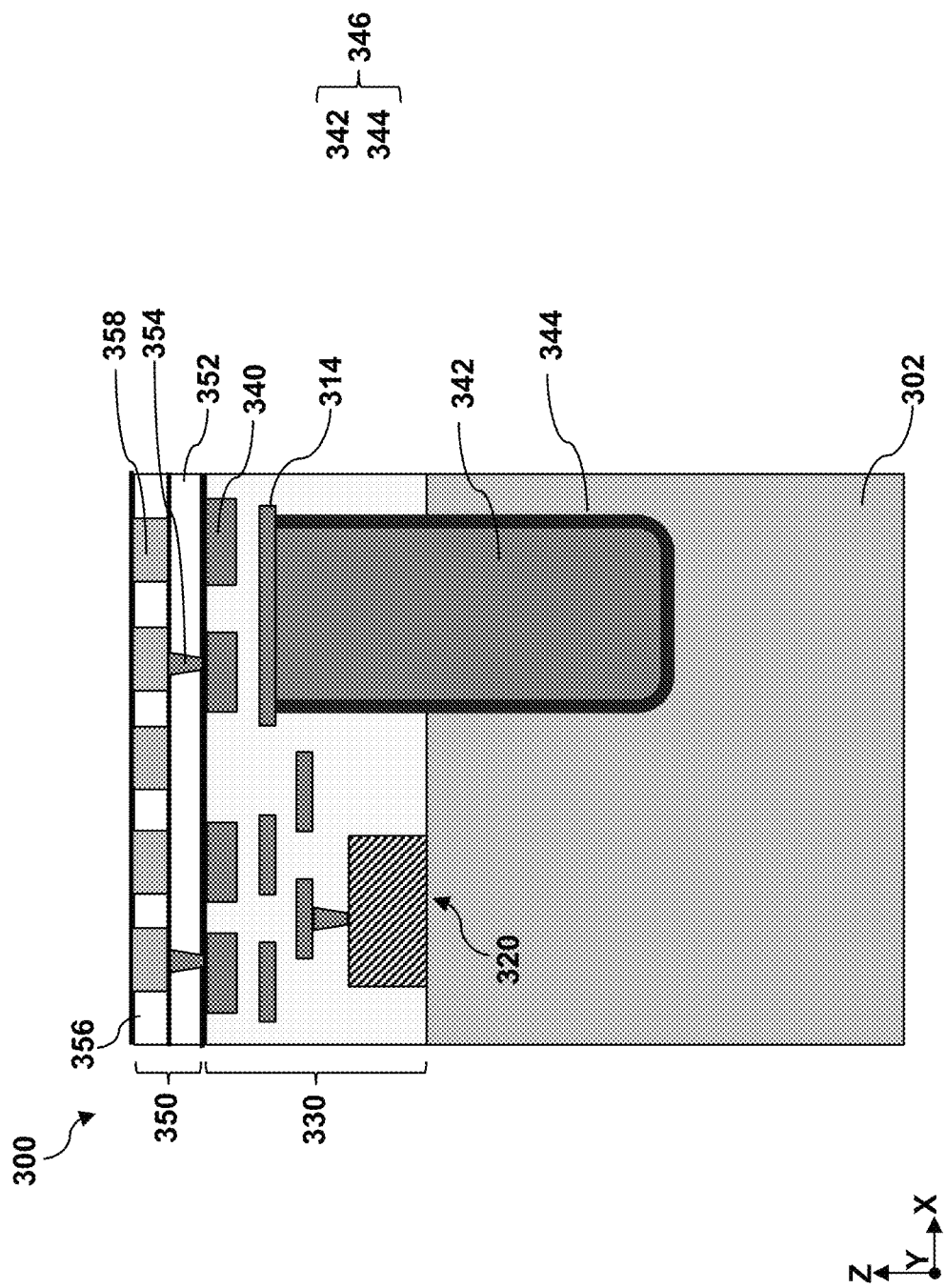

Referring to FIGS. 1, 4 and 5, method 100 includes a block 104 where a first bonding layer 250 is formed over the first wafer 200 and a second bonding layer 350 is formed over the second wafer 300. One of the functions of the first bonding layer 250 and the second bonding layer 350 is to provide an aligned communication interface. The first wafer 200 and the second wafer 300 have different top metal patterns. That is, when the second wafer 300 is flipped upside down, the top metal features 340 on the second wafer 300 will not align with the top metal features 240 on the first wafer 200. The first bonding layer 250 and the second bonding layer 350 redirect patterns of the top metal features on the first wafer 200 and the second wafer 300 to achieve direct wafer-to-wafer communication. Additionally, direct wafer bonding requires a high level of wafer surface planarity and a high density of dummy and functional bonding metal features. The top metal layer does not have the requisite metal feature density for direct wafer bonding processes. Referring to FIG. 4, the first bonding layer 250 includes first contact vias 254 disposed in a first dielectric layer 252 and first bonding pads 258 disposed in a second dielectric layer 256. The first dielectric layer 252 and the second dielectric layer 256 may have a composition similar to the IMD layers described above. The first contact vias 254 and the first bonding pads 258 may include copper (Cu), tantalum (Ta), nickel (Ni), cobalt (Co), aluminum (Al), a combination thereof, or an alloy thereof. In one embodiment, the first contact vias 254 and the first bonding pads 258 may include copper (Cu). Similarly, the second bonding layer 350 shown in FIG. 5 includes second contact vias 354 disposed in a third dielectric layer 352 and second bonding pads 358 disposed in a fourth dielectric layer 356. The third dielectric layer 352 and the fourth dielectric layer 356 may share the same composition with the first dielectric layer 252 and the second dielectric layer 256. The second contact vias 354 and the second bonding pads 358 share the same composition with the first contact vias 254 and the first bonding pads 258. In some embodiments, etch stop layers may be disposed between the interconnect structure (230 or 330) and the dielectric layer (252 or 352), between the dielectric layers (between 252 and 256 or between 352 and 356), or over the top dielectric layer (256 or 356) to provide etch end point control or to provide electromigration suppression. The etch stop layers may include silicon carbide or silicon nitride. To facilitate the subsequent wafer bonding process, the topmost etch stop layer over the second dielectric layer 256 or the fourth dielectric layer 356 may include silicon oxynitride.

Figure 6:
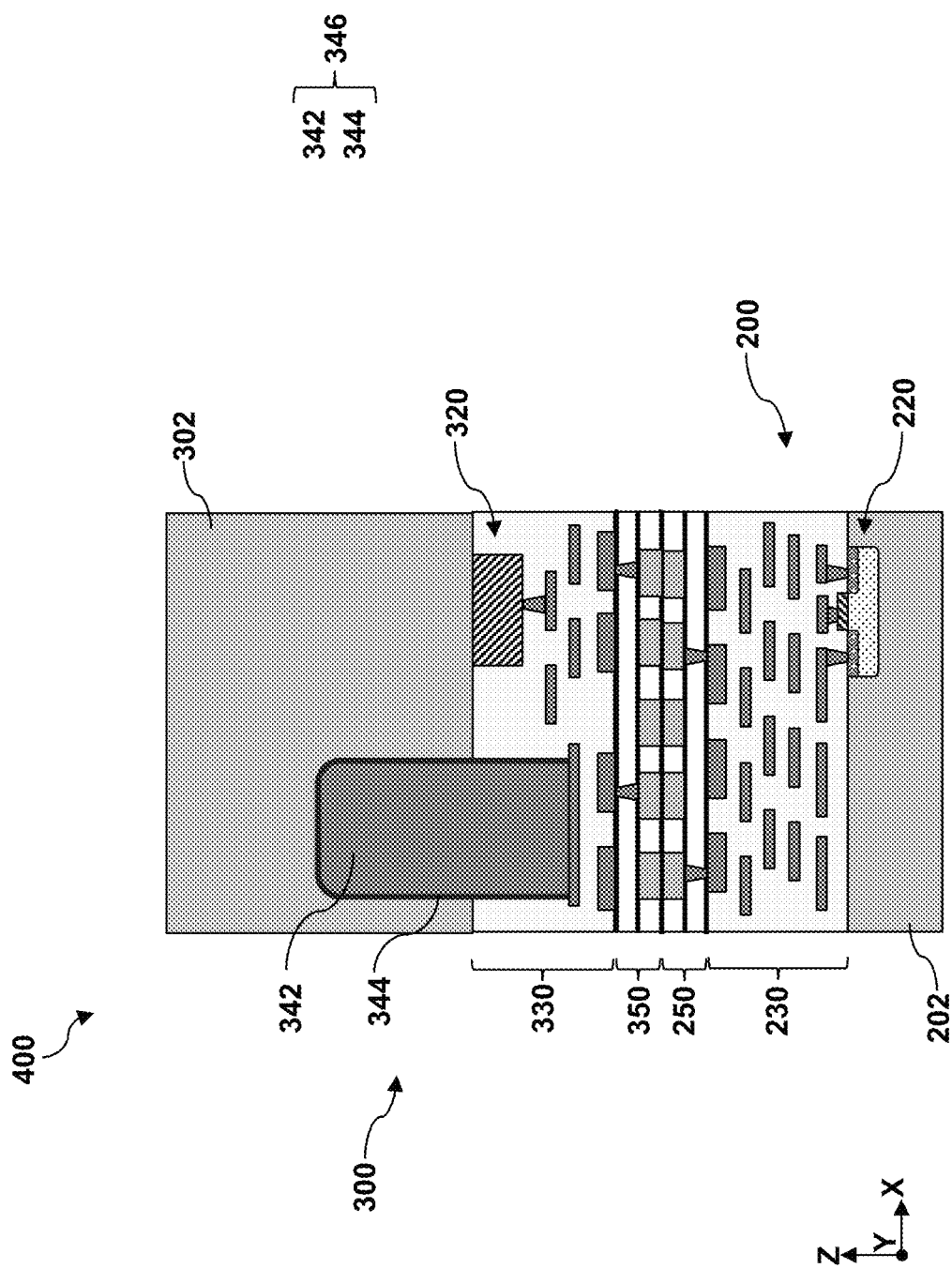

Referring to FIGS. 1 and 6, method 100 includes a block 106 where the second wafer 300 is bonded to the first wafer 200 by bonding the first bonding layer 250 and the second bonding layer 350. At block 106, the second wafer 300, along with the second bonding layer 350, is flipped upside down and bonded to the first wafer 200 to define a wafer stack 400 or a multi-tier semiconductor structure 400. To ensure a strong bonding between the first bonding layer 250 and the second bonding layer 350, surfaces of the first bonding layer 250 and the second bonding layer 350 are cleaned to remove organic and metallic contaminants. In an example process, a sulfuric acid hydrogen peroxide mixture (SPM), a mixture of ammonium hydroxide and hydrogen peroxide (SC1), or both may be used to remove organic contaminants on the first bonding layer 250 and the second bonding layer 350. A mixture of hydrochloric acid and hydrogen peroxide (SC2) may be used to remove metallic contaminants. Besides cleaning, the first bonding pads 258 and the second bonding pads 358 may be treated by an argon plasma or a nitrogen plasma to activate the surfaces thereof. After the second bonding pads 358 in second bonding layer 350 is aligned with the first bonding pads 258 in the first bonding layer 250, an anneal is performed to promote the van der Waals force bonding of the second dielectric layer 256 and the fourth dielectric layer 356 (or top etch stop layers on the second dielectric layer 256 or the fourth dielectric layer 356) as well as the surface-activated bonding (SAB) of the first bonding pads 258 and the second bonding pads 358. In some instances, the anneal includes a temperature between about 200° C. and about 300°. As shown in FIG. 6, the second substrate 302 is on top of the wafer stack 400. Because the second wafer 300 in the wafer stack 400 is now flipped upside down, the FTSV 346 now extends from within the second interconnect structure 330 upward into the second substrate 302. The top surface of the FTSV 346 terminates in the second substrate 302, away from the top surface of the wafer stack 400. In some instances, the FTSV 346 may have a circular cross-section from a top view and may have a diameter between about 10 μm and about 20 μm. The portion of the FTSV 346 in the second substrate 302 may have a height between about 30 μm and about 50 μm.

Figure 7:
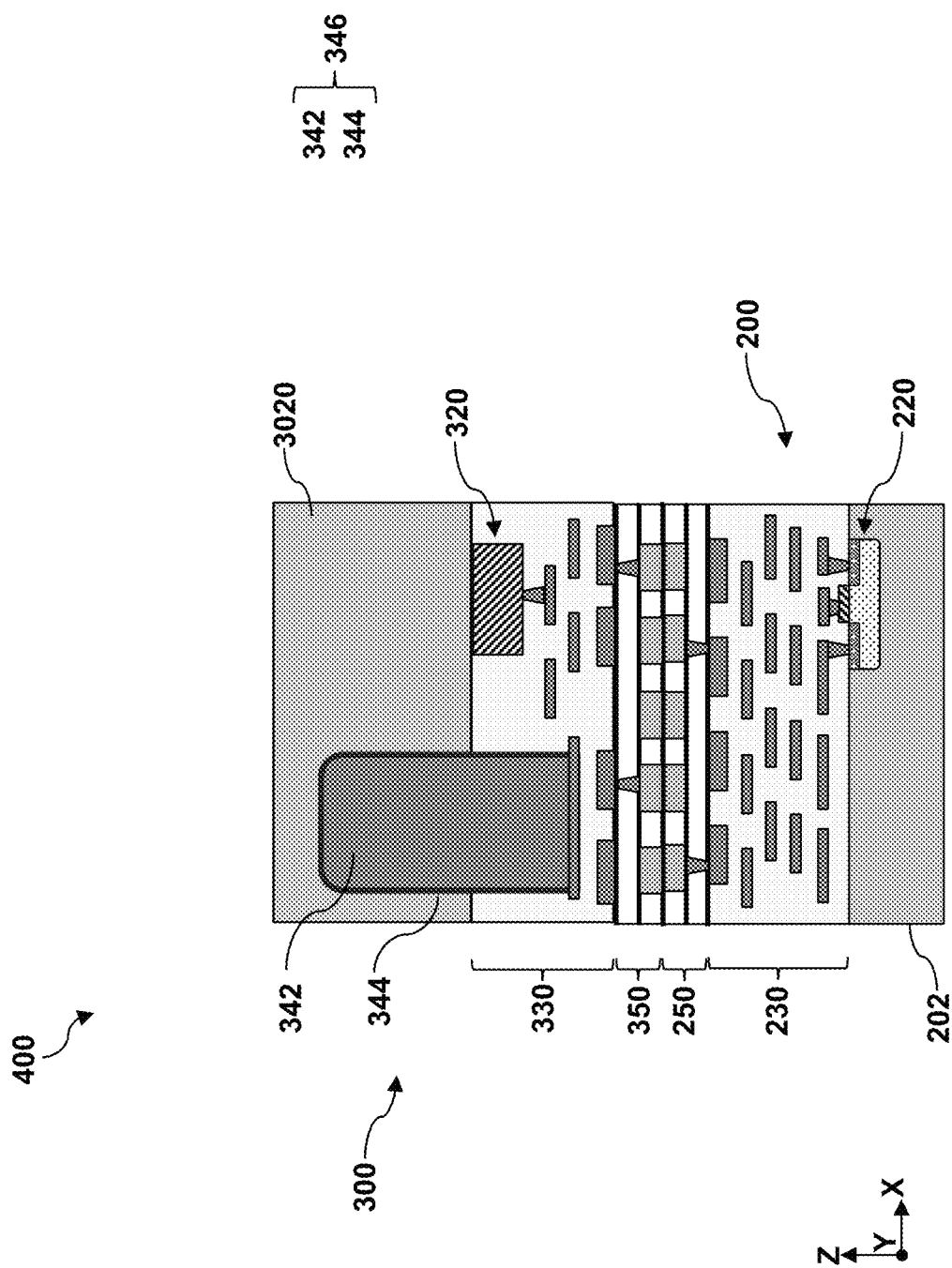

Referring to FIGS. 1 and 7, method 100 includes a block 108 where the second substrate 302 of the second wafer 300 is thinned to form a thinned second substrate 3020. In some embodiments, the wafer stack 400 may undergo multiple thinning and polishing steps to reduce the thickness of the second substrate 302. In an example process, diamond wheels may be used to perform coarse grinding, fine grinding, or super fine grinding and a chemical mechanical polishing (CMP) process may be performed to polishing the second substrate 302 after grinding. In some embodiments, the second substrate 302 may be thinned until a top surface of the thinned second substrate 3020 is about 2 μm and about 4 μm away from the top surface of the FTSV 346. This thickness range is not trivial. When the thickness (between the top surface of the thinned second substrate 302 and the top surface of the FTSV 346) is smaller than 2 μm, the thickness may not be sufficient to accommodate height variation of the FTSV 346. That is, when the thickness is smaller than 2 μm, some FTSV may be exposed during the thinning process. When the thickness is greater than 4 μm, an aspect ratio of the subsequently formed BTSV may be too large to form satisfactory BTSV. For ease of reference and to differentiate from the second substrate 302 before thinning, the second substrate 302 at conclusion of block 108 is referred to as the thinned second substrate 3020.

Figure 8:
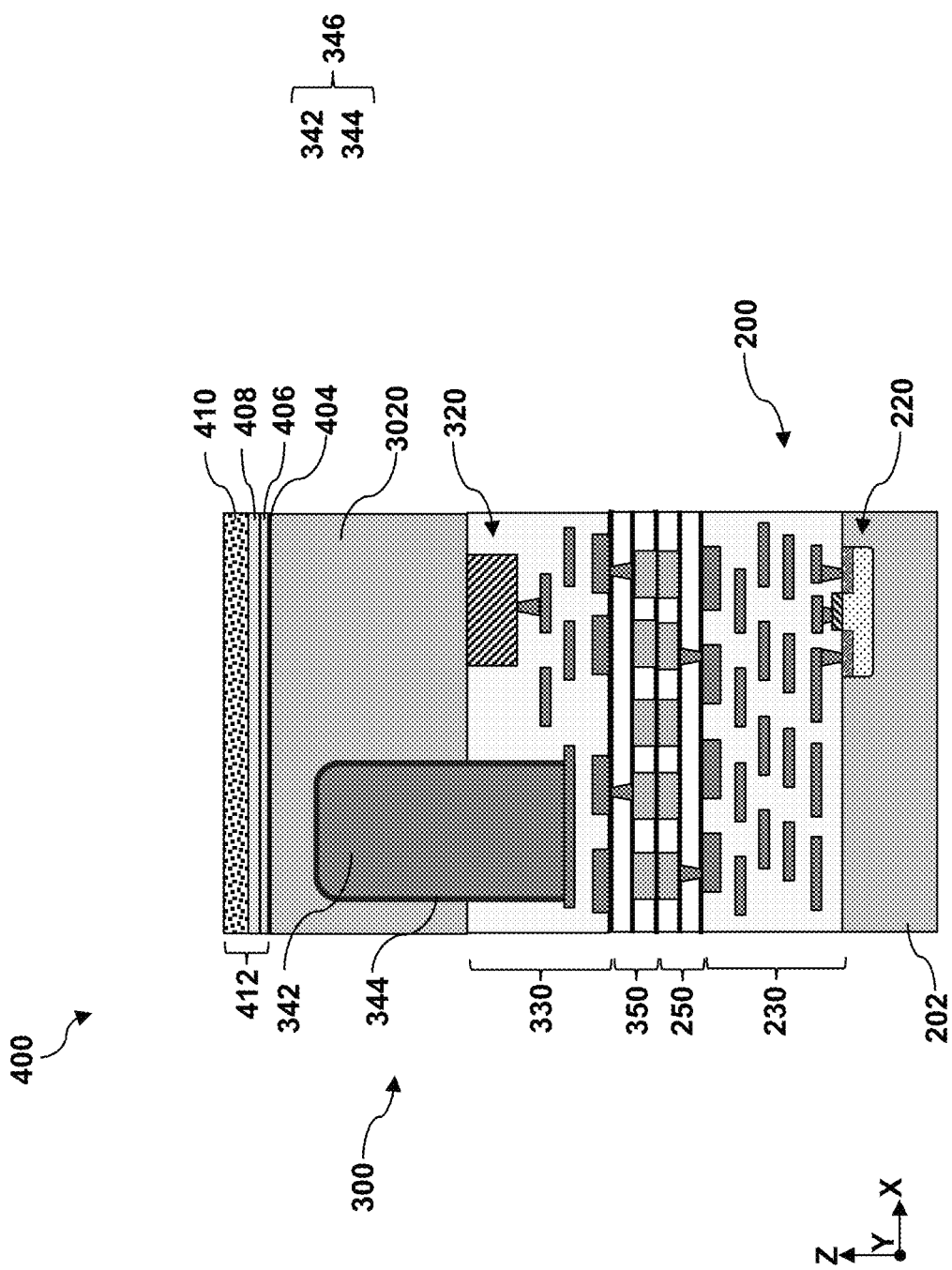

Referring to FIGS. 1 and 8, method 100 includes a block 110 where a protective film 412 is formed over the thinned second substrate 3020. In some embodiments, the protective film 412 is a multi-layer that includes an interfacial layer 404, a first high-k dielectric layer 406 over the interfacial layer 404, a second high-k dielectric layer 408 over the first high-k dielectric layer 406, and a top oxide layer 410 over the second high-k dielectric layer 408. As used herein, a high-k dielectric material refers to a dielectric material having a dielectric constant (k) greater than that of silicon, which is about 3.9. These sublayers in the protective film 412 have different functions. The interfacial layer 404 serves as a buffer layer between the high-k dielectric layer in the first high-k dielectric layer 406 and the semiconductor material in thinned second substrate 3020. In some embodiments, the interfacial layer 404 may include silicon oxide or hafnium silicate. In one embodiment, the interfacial layer 404 includes silicon oxide. The first high-k dielectric layer 406 functions to introduce a built-in negative fixed charge, which can cause accumulation of positive charge in thinned second substrate 3020. The built-in negative fixed charge in the first high-k dielectric layer 406 is demonstrated to reduce leakage through thinned second substrate 3020. In some embodiments, the first high-k dielectric layer 406 may include hafnium oxide. The second high-k dielectric layer 408 is a dense layer that functions as a moisture barrier. In some embodiments, the second high-k dielectric layer 408 may include tantalum oxide. The second high-k dielectric layer 408 functions to prevent water from getting into the first high-k dielectric layer 406. The top oxide layer 410 serves as a hard mask for the subsequent via opening formation processes. In some embodiments, the top oxide layer 410 may be an undoped silicate glass (USG) layer, which includes silicon oxide. In some embodiments, the interfacial layer 404 has a thickness between about 15 Å and about 25 Å. The first high-k dielectric layer 406 has a thickness between about 40 Å and about 80 Å. When the thickness of the first high-k dielectric layer is smaller than 40 Å, there may not be sufficient built-in negative fixed charge to attract positive charge. When the thickness of the first high-k dielectric layer is greater than 80 Å, the built-in negative fixed charge would not increase with thickness and the additional thickness may just occupy more space without any benefit. The second high-k dielectric layer 408 has to be sufficiently thick to serve as a moisture barrier to prevent water from entering the first high-k dielectric layer 406. In some embodiments, the thickness of the second high-k dielectric layer 408 may be between about 400 Å and about 600 Å. Because both the first high-k dielectric layer 406 and the second high-k dielectric layer 408 are formed of metal oxides, they may also be referred to as a first metal oxide layer 406 and a second metal oxide layer 408.

Figure 9:
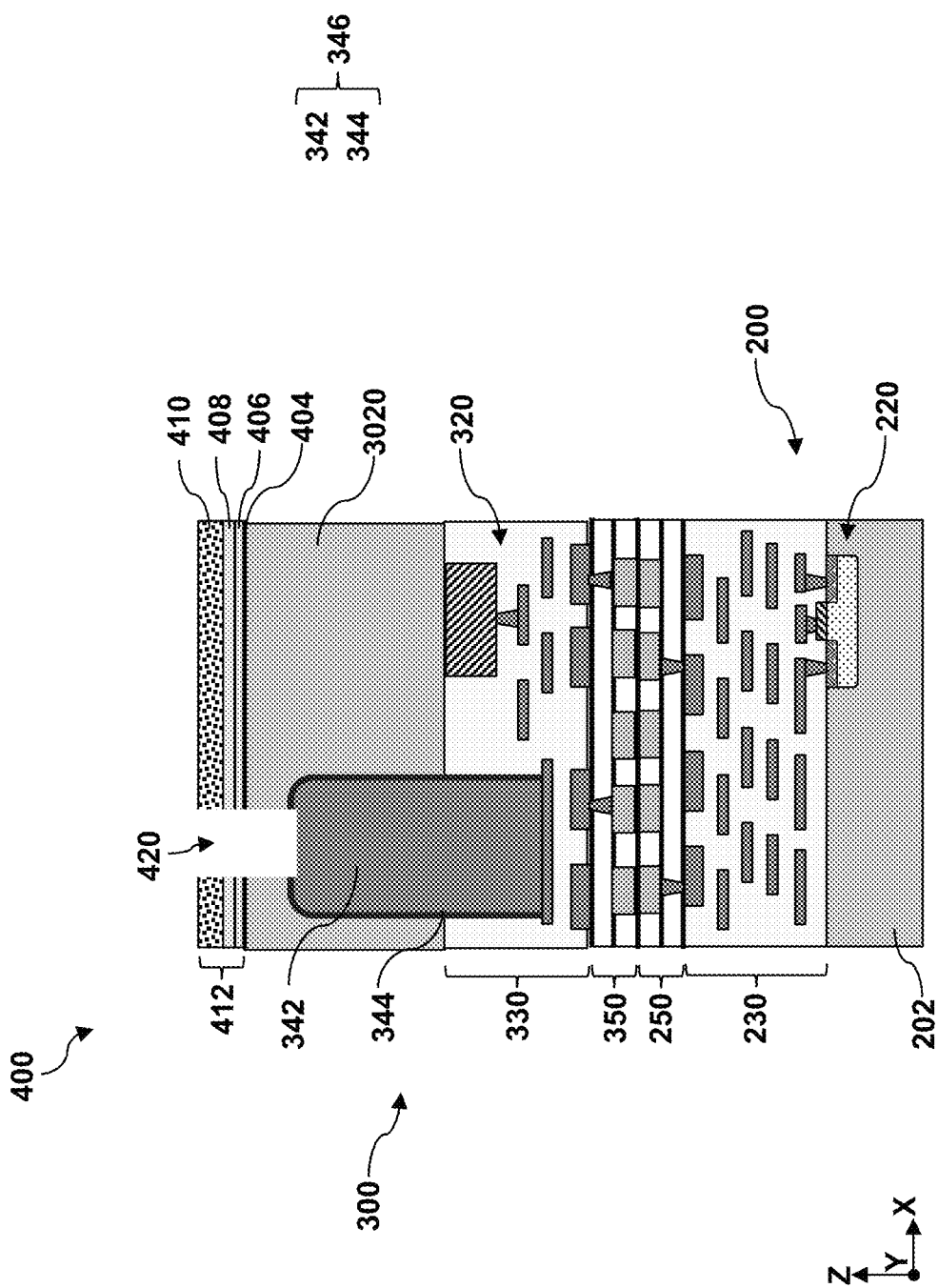

Referring to FIGS. 1 and 9, method 100 includes a block 112 where a backside via opening 420 is formed through the protective film 412 and a portion of thinned second substrate 3020 to expose a top surface of the FTSV 346. In an example process, a photoresist layer is deposited over the top oxide layer 410 using spin-on coating. The deposited photoresist layer may undergo an pre-exposure baking process, exposure to radiation reflected from or transmitted through a photomask, a post-exposure baking process, and developing process, so as to form a patterned photoresist. The top oxide layer 410, the second high-k dielectric layer 408, the first high-k dielectric layer 406, the interfacial layer 404, thinned second substrate 3020, and the TSV liner 344 are then etched using the patterned photoresist as an etch mask to form the backside via opening 420. The conductive TSV filler 342 is exposed in the backside via opening 420. The etching of the top oxide layer 410, the second high-k dielectric layer 408, the first high-k dielectric layer 406, the interfacial layer 404, thinned second substrate 3020, and the TSV liner 344 may include a dry etch process, a wet etch process, or a combination thereof. In some instances, different etch processes or different etchant chemistries may be used. In some implementations represented in FIG. 9, a portion of the TSV filler 342 may be etched as well. After formation of the backside via opening 420, the residual patterned photoresist may be removed by ashing, stripping, or selective etching.

Figure 10:
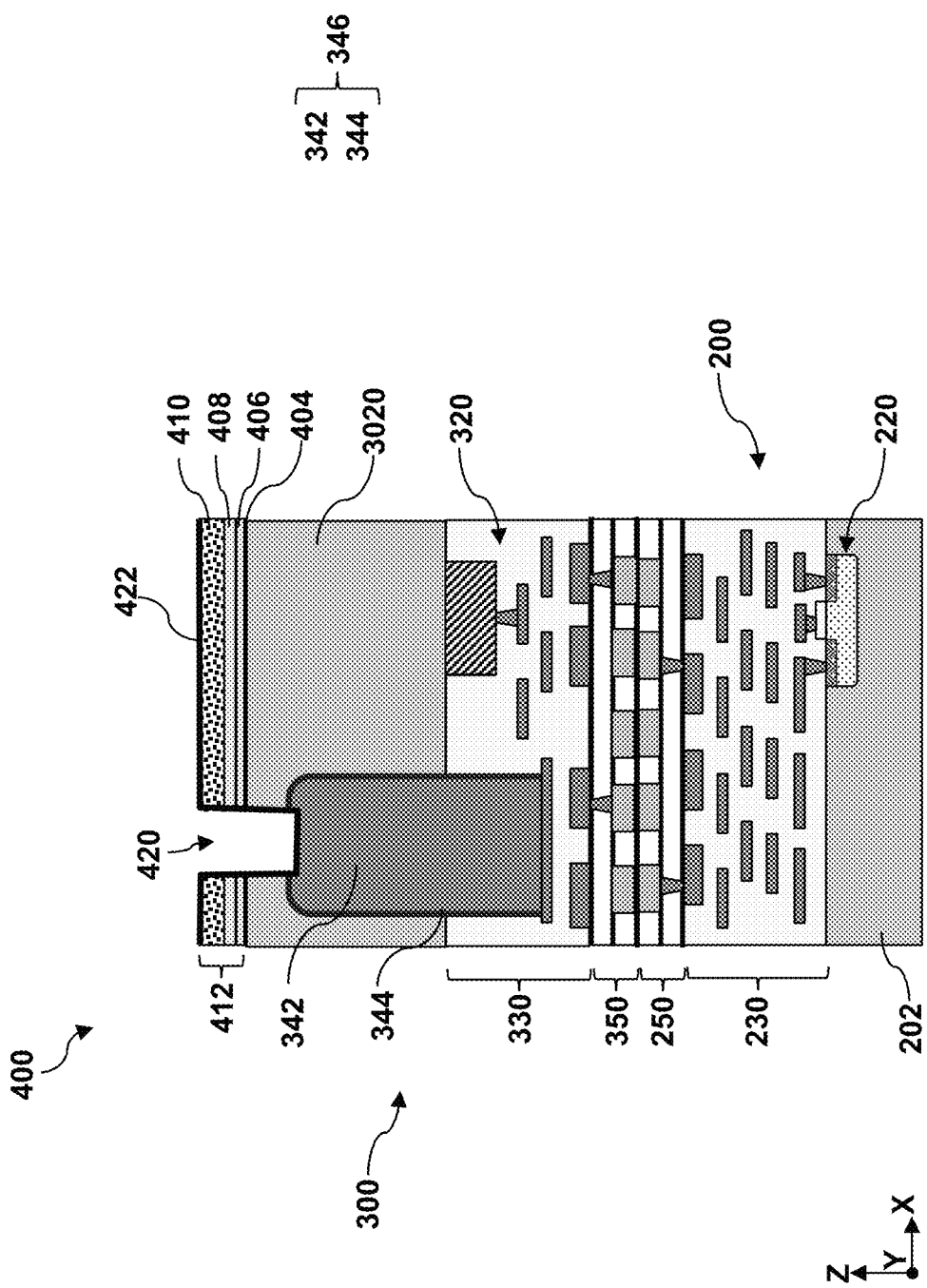
Figure 11:
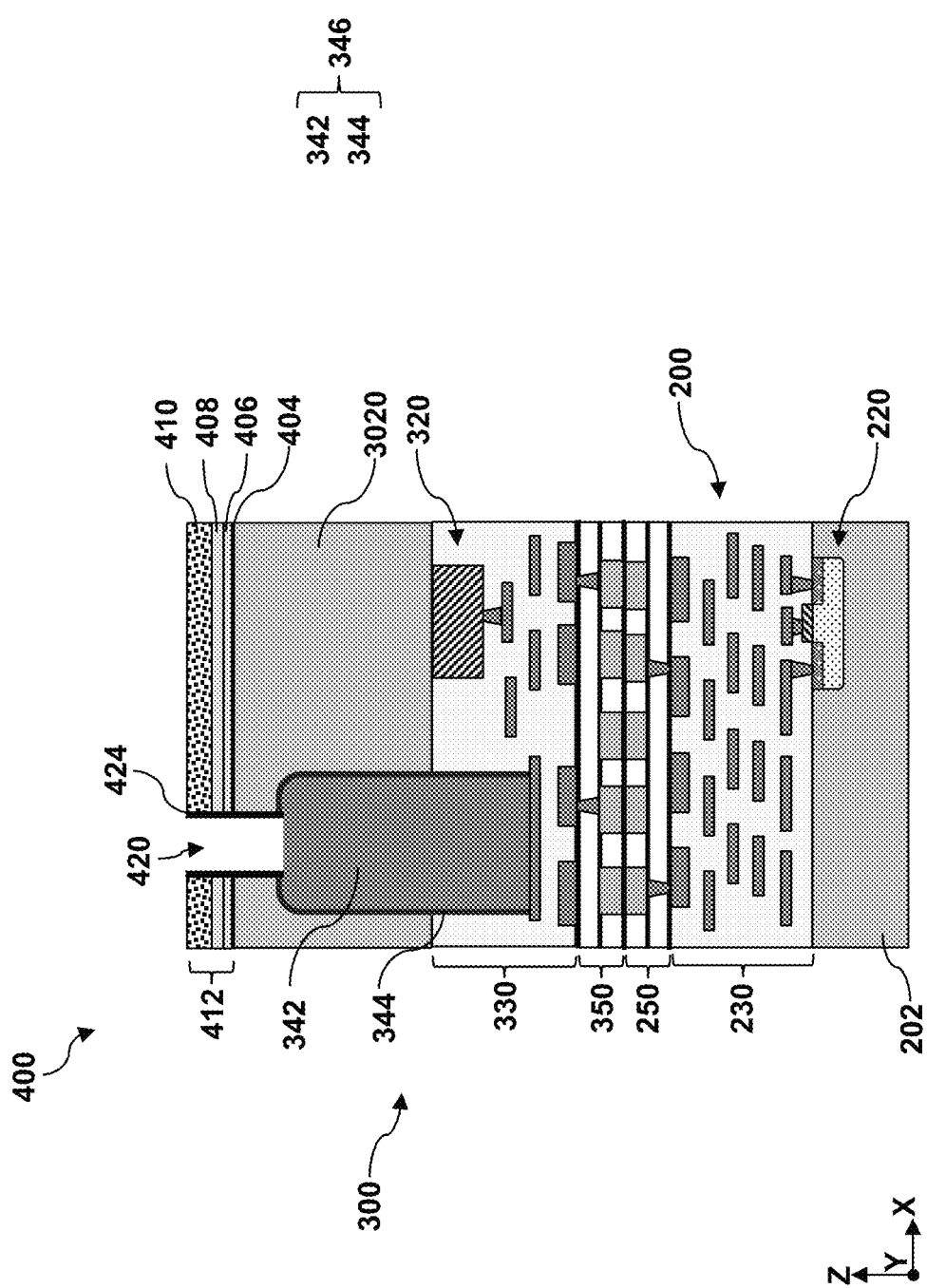

Referring to FIGS. 1, 10 and 11, method 100 includes a block 114 where a via liner 424 is formed over sidewalls of the backside via opening 420. Operations at block 114 may include deposition of a liner material 422 (shown in FIG. 10) and etching back of the liner material 422 to form the via liner 424 (shown in FIG. 11). Referring to FIG. 10, the liner material 422 is conformally deposited over the wafer stack 400, including over the protective film 412 and the backside via opening 420. In some embodiments, the liner material 422 may include dielectric material such as silicon oxide, silicon nitride, or both. The liner material 422 may be deposited using chemical vapor deposition (CVD), atomic layer deposition (ALD), or a suitable method. Referring then to FIG. 11, the conformal liner material 422 is then anisotropically etched back such that the liner material 422 on top-facing surfaces is removed. The anisotropic etch may be a dry etch process that includes use of an oxygen-containing gas (e.g., $O_2$), a fluorine-containing gas (e.g., $SF_6$ or $NF_3$), a chlorine-containing gas (e.g., $Cl_2$ and/or $BCl_3$), a bromine-containing gas (e.g., HBr), an iodine-containing gas, other suitable gases and/or plasmas, and/or combinations thereof. The etch back leaves behind the via liner 424 extending along sidewalls of the backside via opening 420. As shown in FIG. 11, the via liner 424 is in direct physical contact with the top oxide layer 410, the second high-k dielectric layer 408, the first high-k dielectric layer 406, the interfacial layer 404, thinned second substrate 3020, the TSV liner 344, and the TSV filler 342. In some embodiments, the via liner 424 may have a thickness between about 400 Å and about 600 Å.

Figure 12:
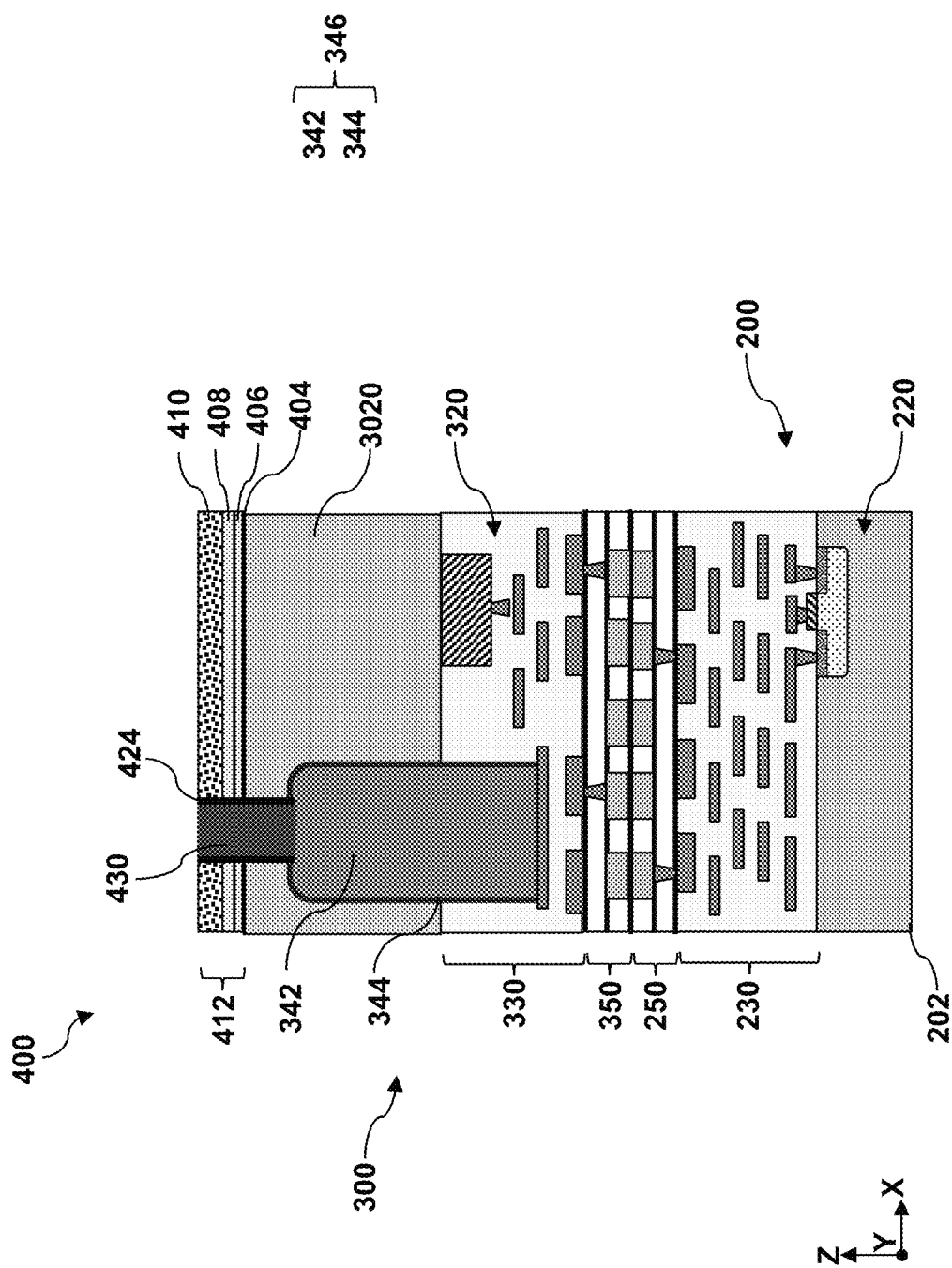

Referring to FIGS. 1 and 12, method 100 includes a block 116 where a backside through substrate via (BTSV) 430 is formed in the backside via opening 420. After the formation of the via liner 424, a metal material is deposited over the wafer stack 400, including over the backside via opening 420. The metal material may include copper (Cu), tantalum (Ta), nickel (Ni), cobalt (Co), aluminum (Al), a combination thereof, or an alloy thereof. In one embodiment, the metal material for block 116 may include copper (Cu). When the metal material is copper (Cu), a seed layer is first deposited in the backside via opening 420 by physical vapor deposition (PVD) or CVD and then an electroplating process is performed to deposit the metal material over the seed layer in the backside via opening 420. While not explicitly shown in the figures, a barrier layer is deposited over the backside via opening 420 before the deposition of the metal material to space the metal material apart from the via liner 424. In some embodiments, the barrier layer may include titanium nitride (TiN), tantalum nitride (TaN), manganese nitride (MnN), or other transition metal nitride. A planarization process, such as a CMP process, is then performed to remove excess material from the top surface of the top oxide layer 410 to form the BTSV 430. In some embodiments, the BTSV 430 may have a circular cross section from a top view and have a diameter between about 0.5 µm and about 4 µm. In some implementations, the diameter of the BTSV 430 is smaller that that of the TSV 346 to ensure landing of the BTSV 430 on the TSV 346.

Figure 13:
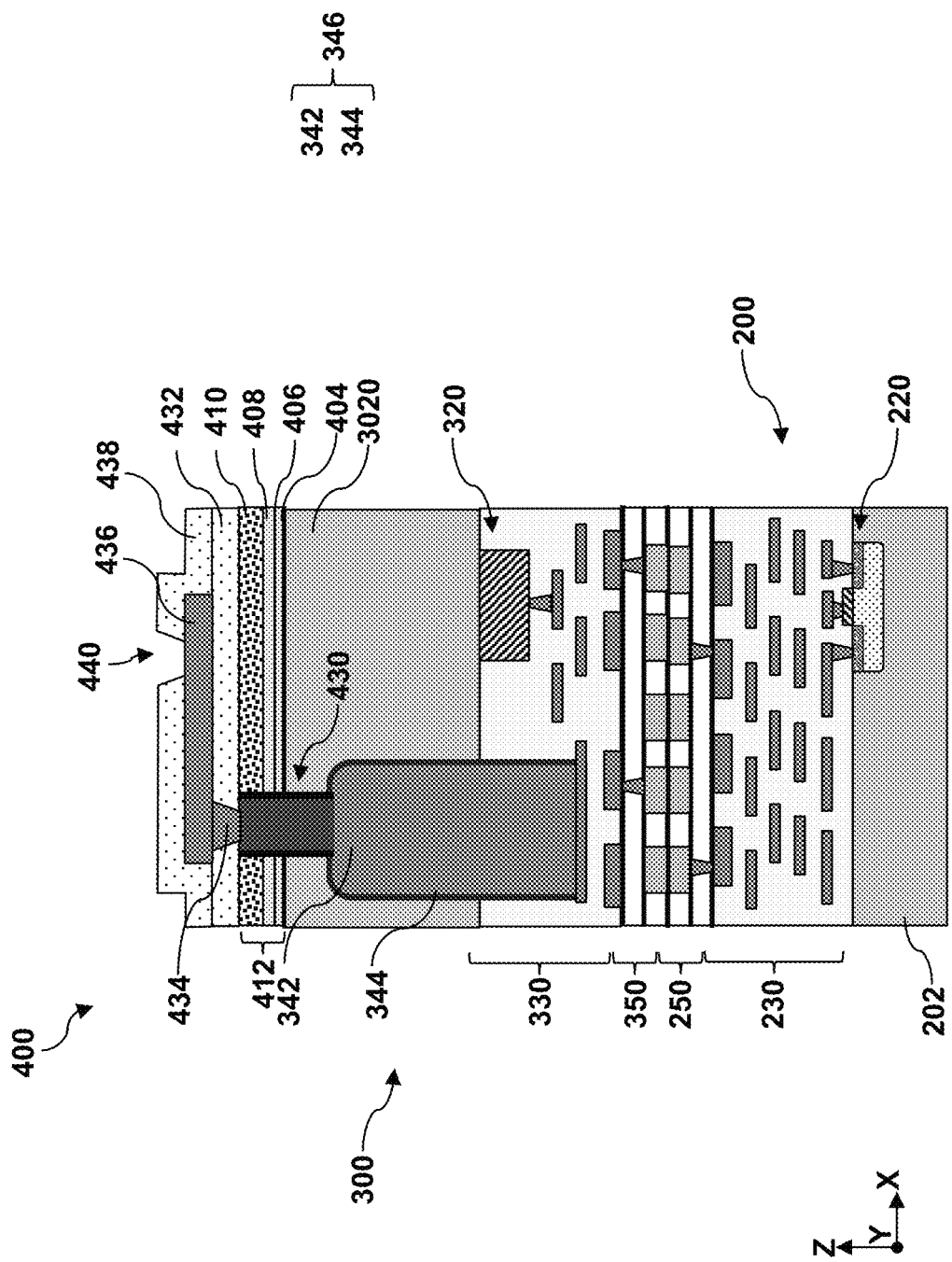
Figure 14:
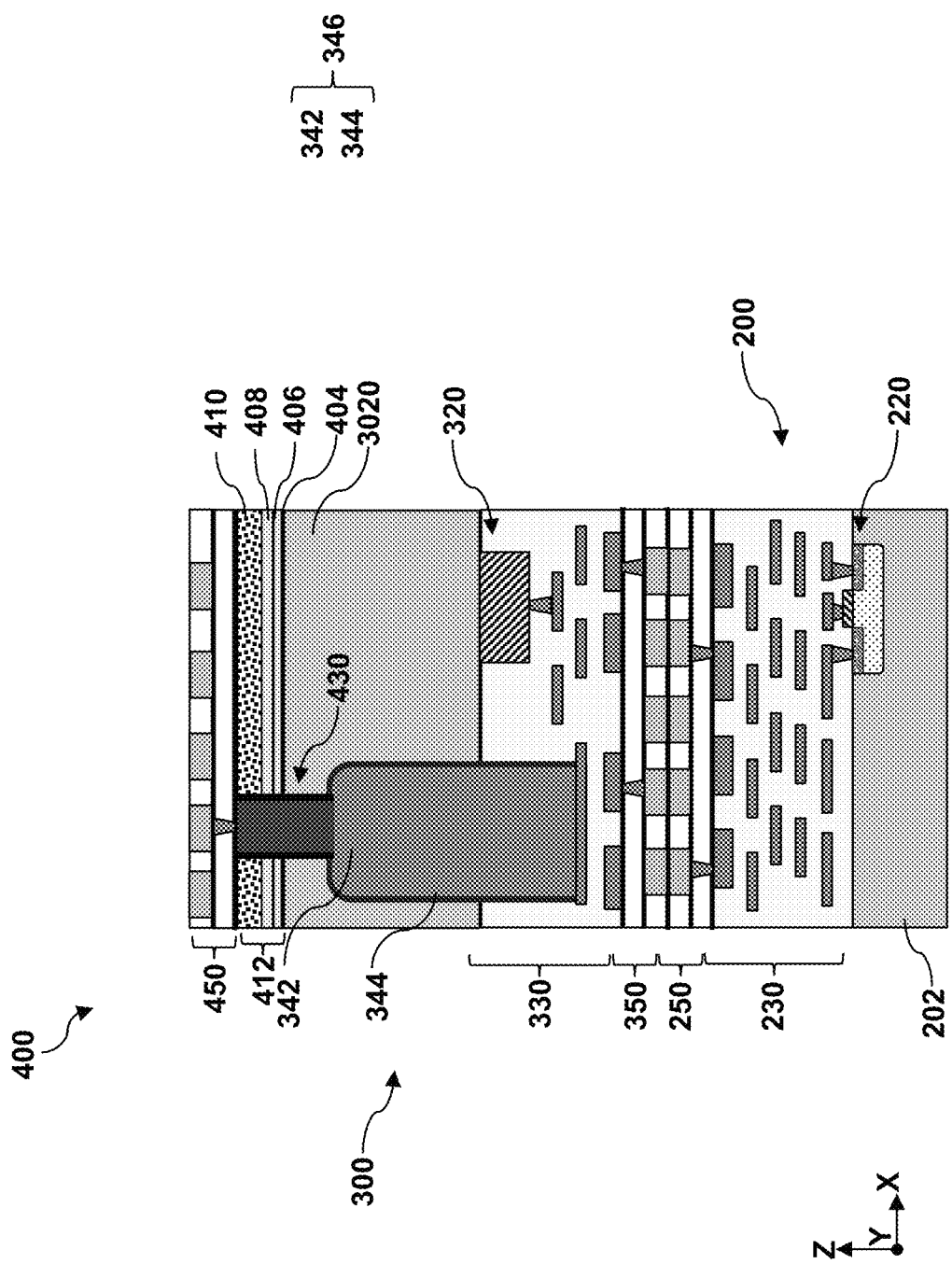

Referring to FIGS. 1, 13 and 14, method 100 includes a block 118 where further processes are performed. Such further processes may include formation of a passivation structure and a bond pad (shown in FIG. 13) when no further wafer is to be bonded to the second wafer 300 or formation of a third bonding layer 450 when at least one additional wafer is to be bonded to the second wafer 300. Reference is first made to FIG. 13, where no other wafer is to be bonded to the second wafer 300. In an example process, a first passivation layer 432 is deposited over the top oxide layer 410 and the BTSV 430. The first passivation layer 432 may include silicate glass (USG), borophosphosilicate glass (BPSG), or the like. A redistribution via opening is then formed through the first passivation layer 432 to expose the BTSV 430. A metal layer is then deposited over the redistribution via opening and the first passivation layer 432. The metal layer is then patterned to form the redistribution via 434 and the bond pad 436. Then a second passivation layer 438 is then deposited over the first passivation layer 432 and the bond pad 436. A bump opening 440 is then formed through the second passivation layer 438 to expose the bond pad 436. In some embodiments, the first passivation layer 432 may include silicate glass (USG), borophosphosilicate glass (BPSG), or the like. The second passivation layer 438 may include silicon nitride, silicon carbide, or silicon carbonitride. The metal layer that forms the redistribution via 434 and the bond pad 436 may include aluminum (Al), copper (Cu), or an aluminum-copper alloy. The bump opening 440 is configured to receive a bump structure that includes an under-bump-metallization (UBM) and a solder bump.

Reference is then made to FIG. 14. When at least one additional wafer is to be bonded to the second wafer, the third bonding layer 450 is formed over the top oxide layer 410 and the BTSV 430. As the third bonding layer 450 may be similar to the first bonding layer 250, detailed description thereof is omitted for brevity. It can be seen that an additional wafer, which is similar to the second wafer 300, may be bonded to the second wafer 300 by way of direct bonding.

To bond to the second wafer 300 using hybrid bonding, such an additional wafer may also include a bonding layer. Both the third bonding layer 450 and the bonding layer on the additional wafer may include contact features. The contact features in the third bonding layer 450 and the contact features in the bonding layer on the additional wafer are vertically aligned during and after the hybrid bonding.

After the wafer-level processing and bonding described in conjunction with FIGS. 2-14, the wafer stack 400 is diced in a die singulation process to obtain individual packages, each of which include vertically stacked chips.

In one exemplary aspect, the present disclosure is directed to a method. The method includes providing a first workpiece that includes a first substrate including a logic transistor and a first interconnect structure disposed on a frontside of the first substrate, providing a second workpiece that includes a second substrate having a memory device and a second interconnect structure disposed on a frontside of the second substrate, and a through via extending through a portion of the second substrate and a portion of the second interconnect structure. The method further includes forming a first bonding layer on the first interconnect structure, forming a second bonding layer on the second interconnect structure, bonding the second workpiece to the first workpiece by directly bonding the second bonding layer to the first bonding layer, thinning the second substrate, forming a protective film over the thinned second substrate, forming a backside via opening through the protective film and the thinned second substrate to expose the through via, and forming a backside through via in the backside via opening to physically couple to the through via.

In some embodiments, the through via is spaced apart from the second substrate by a first liner. In some implementations, the method further includes before the forming of the backside through via, forming a second liner along sidewalls of the backside via opening. In some instances, the first bonding layer includes a first plurality of contact pads, the second bonding layer includes a second plurality of contact pads, and the bonding includes aligning the first plurality of contact pads with the second plurality of contact pads such that each of the first plurality of contact pads is in contact with one of the second plurality of contact pads. In some embodiments, the through via terminates in the second substrate at a bottom surface, the second substrate includes a backside surface away from the second interconnect structure, and the thinning includes thinning the second substrate until the bottom surface is spaced apart from the backside surface is between about 2 µm and about 4 µm. In some embodiments, the protective film includes an interfacial layer on the thinned second substrate, a first dielectric layer on the interfacial layer, a second dielectric layer on the first dielectric layer, and a silicon oxide layer over the second dielectric layer. A dielectric constant of the first dielectric layer and a dielectric constant of the second dielectric layer are greater than a dielectric constant of the silicon oxide layer. In some embodiments, the interfacial layer includes silicon oxide. In some implementations, the first dielectric layer includes hafnium oxide and the second dielectric layer includes tantalum oxide. In some embodiments, a thickness of the second dielectric layer is greater than a thickness of the first dielectric layer.

In another exemplary aspect, the present disclosure is directed to a package structure. The package structure includes a first semiconductor substrate including a logic transistor, a first interconnect structure disposed over the first semiconductor substrate, a first bonding layer disposed on the first interconnect structure, a second bonding layer disposed on and bonded to the first bonding layer, a second interconnect structure disposed over the second bonding layer, a second semiconductor substrate disposed over the second interconnect structure, the second semiconductor substrate including a memory device, a protective film disposed on the second semiconductor substrate, a first through via extending through a portion of the second interconnect structure and a first portion of the second semiconductor substrate, and a second through via extending through the protective film and a second portion of the second semiconductor substrate to physical contact a top surface of the first through via. A first diameter of the first through via is greater than a second diameter of the second through via.

In some embodiments, a distance between the top surface and a top surface of the second semiconductor substrate is between about 2 µm and about 4 µm. In some implementations, the first diameter is between about 10 µm and about 20 µm and the second diameter is between about 0.5 µm and about 4 µm. In some instances, the first bonding layer includes a first plurality of contact pads, the second bonding layer includes a second plurality of contact pads, and each of the first plurality of contact pads is in contact with one of the second plurality of contact pads. In some embodiments, the memory device is a dynamic random access memory (DRAM) device. In some instances, the first portion of the second semiconductor substrate includes a thickness between about 30 µm and about 50 µm. In some implementations, the protective film includes an interfacial layer on the second semiconductor substrate a first metal oxide dielectric layer on the interfacial layer, a second metal oxide dielectric layer on the first metal oxide dielectric layer, and a silicon oxide layer over the second metal oxide dielectric layer. In some implementations, the first metal oxide dielectric layer includes hafnium oxide and the second metal oxide dielectric layer includes tantalum oxide.

In yet another exemplary aspect, the present disclosure is directed to a high-bandwidth memory (HBM) device. The HBM device includes a logic die that includes a first substrate including a logic transistor, a first interconnect structure over the first substrate, a memory die including a second interconnect structure bonded to the first interconnect structure, a second substrate disposed on the second interconnect structure and including a memory device, and a frontside through via extending through a portion of the second interconnect structure and a portion of the second substrate, a protective film disposed on the second substrate, and a backside through via extending through the protective film and the second substrate to physically contact the frontside through via. The protective film includes an interfacial layer on the second substrate, a first metal oxide dielectric layer on the interfacial layer, a second metal oxide dielectric layer on the first metal oxide dielectric layer, and a silicon oxide layer over the second metal oxide dielectric layer.

In some embodiments, the memory device is a dynamic random access memory (DRAM) device. In some implementations, a first diameter of the frontside through via is greater than a second diameter of the backside through via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing a first workpiece that includes:
        a first substrate comprising a logic transistor, and
        a first interconnect structure disposed on a frontside of the first substrate;
    providing a second workpiece that includes:
        a second substrate comprising a memory device,
        a second interconnect structure disposed on a frontside of the second substrate, and
        a through via extending through a portion of the second substrate and a portion of the second interconnect structure;
    forming a first bonding layer on the first interconnect structure;
    forming a second bonding layer on the second interconnect structure;
    bonding the second workpiece to the first workpiece by directly bonding the second bonding layer to the first bonding layer;
    thinning the second substrate;
    forming a protective film over the thinned second substrate;
    forming a backside via opening through the protective film and the thinned second substrate to expose the through via; and
    forming a backside through via in the backside via opening to physically couple to the through via.

2. The method of claim 1, wherein the through via is spaced apart from the second substrate by a first liner.

3. The method of claim 1, further comprising:
    before the forming of the backside through via, forming a second liner along sidewalls of the backside via opening.

4. The method of claim 1,
    wherein the first bonding layer comprises a first plurality of contact pads,
    wherein the second bonding layer comprises a second plurality of contact pads,
    wherein the bonding comprises aligning the first plurality of contact pads with the second plurality of contact pads such that each of the first plurality of contact pads is in contact with one of the second plurality of contact pads.

5. The method of claim 1,
    wherein the through via terminates in the second substrate at a bottom surface,
    wherein the second substrate comprises a backside surface away from the second interconnect structure,
    wherein the thinning comprises thinning the second substrate until the bottom surface is spaced apart from the backside surface is between about 2 µm and about 4 µm.

6. The method of claim 1, wherein the protective film comprises:
    an interfacial layer on the thinned second substrate;
    a first dielectric layer on the interfacial layer;
    a second dielectric layer on the first dielectric layer; and
    a silicon oxide layer over the second dielectric layer, wherein a dielectric constant of the first dielectric layer and a dielectric constant of the second dielectric layer are greater than a dielectric constant of the silicon oxide layer.

7. The method of claim 6, wherein the interfacial layer comprises silicon oxide.

8. The method of claim 6,
wherein the first dielectric layer comprises hafnium oxide,
wherein the second dielectric layer comprises tantalum oxide.

9. The method of claim 6, wherein a thickness of the second dielectric layer is greater than a thickness of the first dielectric layer.

10. A package structure, comprising:
a first semiconductor substrate comprising a logic transistor;
a first interconnect structure disposed over the first semiconductor substrate;
a first bonding layer disposed on the first interconnect structure;
a second bonding layer disposed on and bonded to the first bonding layer;
a second interconnect structure disposed over the second bonding layer;
a second semiconductor substrate disposed over the second interconnect structure, the second semiconductor substrate comprising a memory device;
a protective film disposed on the second semiconductor substrate;
a first through via extending through a portion of the second interconnect structure and a first portion of the second semiconductor substrate; and
a second through via extending through the protective film and a second portion of the second semiconductor substrate to physical contact a top surface of the first through via,
wherein a first diameter of the first through via is greater than a second diameter of the second through via.

11. The package structure of claim 10, wherein a distance between the top surface and a top surface of the second semiconductor substrate is between about 2 µm and about 4 µm.

12. The package structure of claim 10,
wherein the first diameter is between about 10 µm and about 20 µm,
wherein the second diameter is between about 0.5 µm and about 4 µm.

13. The package structure of claim 10,
wherein the first bonding layer comprises a first plurality of contact pads,
wherein the second bonding layer comprises a second plurality of contact pads,
wherein each of the first plurality of contact pads is in contact with one of the second plurality of contact pads.

14. The package structure of claim 10, wherein the memory device is a dynamic random access memory (DRAM) device.

15. The package structure of claim 10, wherein the first portion of the second semiconductor substrate comprises a thickness between about 30 µm and about 50 µm.

16. The package structure of claim 10, wherein the protective film comprises:
an interfacial layer on the second semiconductor substrate;
a first metal oxide dielectric layer on the interfacial layer;
a second metal oxide dielectric layer on the first metal oxide dielectric layer; and
a silicon oxide layer over the second metal oxide dielectric layer.

17. The package structure of claim 16,
wherein the first metal oxide dielectric layer comprises hafnium oxide,
wherein the second metal oxide dielectric layer comprises tantalum oxide.

18. A high-bandwidth memory (HBM) device, comprising:
a logic die comprising:
a first substrate comprising a logic transistor, and
a first interconnect structure over the first substrate;
a memory die comprising:
a second interconnect structure bonded to the first interconnect structure,
a second substrate disposed on the second interconnect structure and comprising a memory device, and
a frontside through via extending through a portion of the second interconnect structure and a portion of the second substrate;
a protective film disposed on the second substrate, wherein the protective film comprises:
an interfacial layer on the second substrate,
a first metal oxide dielectric layer on the interfacial layer,
a second metal oxide dielectric layer on the first metal oxide dielectric layer, and
a silicon oxide layer over the second metal oxide dielectric layer; and
a backside through via extending through the protective film and the second substrate to physically contact the frontside through via.

19. The HBM device of claim 18, wherein the memory device is a dynamic random access memory (DRAM) device.

20. The HBM device of claim 18, wherein a first diameter of the frontside through via is greater than a second diameter of the backside through via.

* * * * *